(12) United States Patent
Glatz et al.

(10) Patent No.: US 10,737,397 B2
(45) Date of Patent: Aug. 11, 2020

(54) ROBOT GRIPPER FOR HANDLING OBJECTS, IN PARTICULAR CONTAINERS

(71) Applicant: KUKA Deutschland GmbH, Augsburg (DE)

(72) Inventors: Hans Glatz, Augsburg (DE); Eugen Schukow, Augsburg (DE); Adil Akbas, Augsburg (DE)

(73) Assignee: KUKA Deutschland GmbH, Augsburg (DE)

( * ) Notice: Subject to any disclaimer, the term of this patent is extended or adjusted under 35 U.S.C. 154(b) by 0 days.

(21) Appl. No.: 16/605,438

(22) PCT Filed: Apr. 10, 2018

(86) PCT No.: PCT/EP2018/059137
§ 371 (c)(1),
(2) Date: Oct. 15, 2019

(87) PCT Pub. No.: WO2018/192799
PCT Pub. Date: Oct. 25, 2018

(65) Prior Publication Data
US 2020/0070360 A1  Mar. 5, 2020

(30) Foreign Application Priority Data

Apr. 20, 2017  (DE) .......................... 10 2017 206 652

(51) Int. Cl.
*B25J 15/00* (2006.01)
(52) U.S. Cl.
CPC ................................ *B25J 15/0033* (2013.01)

(58) Field of Classification Search
CPC ...... B25J 15/0033; B25J 15/106; B25J 15/12; B25J 15/0023; B25J 9/1612
(Continued)

(56) References Cited

U.S. PATENT DOCUMENTS 3,078,984 A * 2/1963 Baker ....................... B21C 1/28
294/87.1
6,468,021 B1  10/2002 Bonora et al.
(Continued)

FOREIGN PATENT DOCUMENTS

DE  202005007347 U1  7/2005
DE  202010007169 U1  12/2011

OTHER PUBLICATIONS

European Patent Office; Search Report in related International Patent Application No. PCT/EP2018/059137 dated Jun. 14, 2018; 4 pages.

*Primary Examiner* — Paul T Chin
(74) *Attorney, Agent, or Firm* — Dorton & Willis, LLP (57) ABSTRACT

A robot gripper for handling objects having at least one retaining foot by means of a robot. A gripper main part has a connection flange designed to secure the robot gripper to a tool flange of a robot arm, and a counter bearing that is connected to the gripper main part and has a cutout. The shape and size of the cutout is adapted to the retaining foot of the object to receive same in a formfitting manner. An actuator is arranged on the gripper main part, preferably in an adjustably mounted manner, and is designed to press against the retaining foot in a clamping position to fix the retaining foot against the counter bearing, and to release the retaining foot in a release position such that the counter bearing can be adjusted relative to the retaining foot to allow the retaining foot to be released from the robot gripper.

20 Claims, 9 Drawing Sheets

(58) Field of Classification Search
USPC .......................................... 294/192, 208, 65
See application file for complete search history.

(56) References Cited

U.S. PATENT DOCUMENTS

| | | | |
|---|---|---|---|
| 10,668,629 B2* | 6/2020 | Curhan | ................ B25J 15/0023 |
| 2009/0297299 A1 | 12/2009 | Campbell et al. | |
| 2011/0005966 A1 | 1/2011 | Chiu | |
| 2011/0245964 A1 | 10/2011 | Sullivan | |
| 2014/0367987 A1* | 12/2014 | Xiao | ...................... B25J 15/022 |
| | | | 294/192 |
| 2015/0063963 A1 | 3/2015 | Kinugawa | |
| 2015/0235883 A1 | 8/2015 | Hsieh et al. | |
| 2015/0255318 A1 | 9/2015 | Wada et al. | |
| 2015/0287623 A1 | 10/2015 | Wada | |

* cited by examiner

ROBOT GRIPPER FOR HANDLING OBJECTS, IN PARTICULAR CONTAINERS

CROSS-REFERENCE TO RELATED APPLICATIONS

This application is a national phase application under 35 U.S.C. § 371 of International Patent Application No. PCT/EP2018/059137, filed Apr. 10, 2018 (pending), which claims the benefit of priority to German Patent Application No. DE 10 2017 206 652.0, filed Apr. 20, 2017, the disclosures of which are incorporated by reference herein in their entirety.

TECHNICAL FIELD

The invention relates to a robot gripper for handling objects that comprise at least one retaining foot in each case, in particular containers, valves or any objects comprising a flange, by means of a robot comprising a gripper body that comprises a connection flange that is designed for fastening the robot gripper to a tool flange of a robot arm. The invention furthermore relates to an associated method.

BACKGROUND

DE 20 2010 007 169 U1 discloses a device for handling and/or transporting containers, in particular cask-like or conical containers, comprising a gripper for said containers that is provided on a robot or a handling means.

US 2009/0297299 A1 discloses cleanroom containers that are designed for transporting in particular thin discs of semiconductor material on which integrated circuits are built i.e. wafers. Cleanroom containers of this kind are also referred to, among experts, as FOUP (Front Opening Unified Pod/Front Opening Universal Pod). Cleanroom containers of this kind comprise a container housing that comprises at least one retaining foot on the outer wall thereof, such that the cleanroom containers can be handled in an automated manner.

SUMMARY

The object of the invention is that of providing a robot gripper and an associated method, by means of which objects comprising at least one retaining foot, in particular containers, valves or any objects comprising a flange, can be simply and reliably handled, in an automated manner, by means of a robot.

This object is inventively achieved by a robot gripper for handling objects that comprise at least one retaining foot in each case, in particular containers, valves or any objects comprising a flange, by means of a robot comprising a gripper body that comprises a connection flange that is designed for fastening the robot gripper to a tool flange of a robot arm, and further comprising a counterstay that is connected to the gripper body and comprises a cutout, the shape and size of which are adjusted to the retaining foot of the object, in order to be able to receive said foot in a form-fitting manner, and an actuator which is arranged, preferably adjustably mounted, on the gripper body and is designed to press against the retaining foot of the object in a clamping position in order to fix said foot against the counterstay, and to release the retaining foot in a release position, such that the counterstay can be adjusted relative to the retaining foot in order for it to be possible for the retaining foot of the object to be detached from the robot gripper.

The retaining foot or a head portion of the retaining foot of the object is retained in a form-fitting manner, in particular clamped, by means of the counterstay and the actuator. In this respect, the actuator forms a pressure piece which pushes or presses the retaining foot or the head portion of the retaining foot against an inner wall of the counterstay. The actuator can in particular be a passive actuator, i.e. it is not actively driven but is instead adjustable only passively, for example by means of a movement of the robot arm that presses the robot gripper against the object. The adjustability of the counterstay with respect to the retaining foot can be achieved in particular by means of a rotational movement. The rotational movement can in particular be performed only by a movement of the robot arm. In this respect, the robot gripper can be designed in a driveless manner overall, i.e. so as to be purely passive. In the simplest embodiment, the rotational movement of the robot arm can be a rotation of the tool flange of the robot arm that is driven by a joint motor of the robot arm. The retaining foot of the object may comprise a support portion that has a reduced periphery relative to the head portion of the retaining foot and that connects the head portion to an object wall, in particular container wall, of the object, in particular of the container. The head portion is designed so as to have a larger periphery than the support portion to such an extent that the retaining foot forms an undercut in which the counterstay can engage in a form-fitting manner.

The cutout of the counterstay may be designed as a window cutout that is closed around the peripheral edge thereof, the inner contour of the window cutout at least substantially corresponding to an outer contour of a head portion of the retaining foot of the object, and the outer contour of the head portion of the retaining foot having a contour shape that forms at least one projection that engages behind at least one latching recess of the counterstay in a locking position of the robot gripper.

The counterstay may be fastened to the robot gripper so as to be at a distance from the gripper body, such that a free space is formed between the counterstay and the gripper body, which free space is designed for the purpose of rotating the robot gripper relative to the retaining foot of the object when the head portion of the retaining foot has plunged into the free space of the robot gripper, beyond the cutout of the counterstay.

The counterstay may comprise an inner wall that faces the gripper body and forms at least one latching recess for the head portion of the retaining foot of the object or of the at least one projection of the head portion of the retaining foot of the object.

The actuator may be a punch that is arranged axially, preferably mounted so as to be adjustable, in the center of the robot gripper and comprises a punch head that is designed to press against a corresponding seat on the head portion of the retaining foot of the object. The punch head can be used for fine positioning of the robot gripper on the retaining foot. For this purpose, the actuator may comprise a conical tip that is matched to a corresponding conical surface of the retaining foot. In this case, the robot may comprise a torque sensor in order for it to be possible to use the actuator as a centering point. Robot can make use of said centering point for fine positioning on the conical bore of the retaining foot. This is particularly expedient if there is a deviation from camera data given by way of example, for instance owing to tolerances.

The actuator can be mounted on the gripper body so as to be biased, by means of a spring device, such that the spring device generates a spring force that presses the actuator, in the clamping position thereof, automatically against the head portion of the retaining foot of the object.

The retaining foot may be any protruding element of an object, preferably a flange, which can more preferably be engaged with from behind or below.

In all the embodiments, the robot gripper may comprise a securing means which is designed for automatically locking the actuator in the clamping position thereof. The securing means prevents undesired movement of the actuator, in particular undesired detachment of the actuator from the retaining foot of the object if the actuator were to be pushed away, for example counter to the spring force of the spring device. The securing means can, for example, comprise a linear solenoid that actuates a securing pin or a securing pin or a securing detent. In this respect, the securing means forms a mechanical locking means.

The robot gripper may comprise a centering pin which comprises a centering cone on the free front end thereof and/or which forms a guide on which the actuator is guided in an axially adjustable manner. Furthermore, the actuator may preferably also comprise a centering cone on the free front end thereof.

In all of the embodiments the robot gripper may comprise at least one sensor which is designed to record the relative position of the robot gripper with respect to the object in at least one measured variable. The sensor may be a distance sensor. The sensor may be an optical sensor, such as a camera. The sensor can assist or facilitate, and in particular allow for automated performance of, an approach of the robot gripper to the object and/or the coupling/threading of the robot gripper on the retaining foot of the object, which is performed by the robot arm and is program-controlled by the robot control. For example, the object may comprise a marking or identification, such as a 2D code, in particular a barcode, matrix code or a QR code, which is recorded and evaluated by the optical sensor, in particular the camera, in order to control the approach.

In a first embodiment, the sensor may be designed as a camera that is oriented such that the optical axis thereof extends in parallel with a lateral longitudinal edge of the object. It is thus possible for the space located beside a gripped object to be optically monitored in a simple manner.

In a second embodiment, the sensor may be designed as a camera that is oriented such that the optical axis thereof extends transversely to a lateral longitudinal edge of the object, the robot gripper comprising at least one deflection mirror that is designed to deflect light from a direction extending in parallel with a lateral longitudinal edge of the object into the direction extending transversely to the lateral longitudinal edge of the object, in which direction the optical axis of the camera extends. An orientation of the sensor or the camera such that the optical axis thereof extends transversely to the lateral longitudinal edge of the object achieves a compact design of the robot gripper. Furthermore, the space located beside a gripped object can be optically monitored in a simple manner by means of the deflection mirror that is preferably smaller and lighter weight than the sensor.

In general, the robot gripper may comprise a second sensor that is designed and arranged so as to monitor, for obstacles, a space provided to the side of an object gripped by the robot gripper. A desired deposition place for the object can be checked, i.e. the presence of a free place for depositing the object, can be identified by the second sensor, which can also be designed as a camera.

Alternatively or in addition, the robot gripper can comprise a third sensor which is designed and arranged so as to monitor the presence of the object, in particular of the retaining foot of the object on the counterstay of the robot gripper. For this purpose, the third sensor can be arranged for example on a counterstay of the robot gripper and be oriented towards the inside, such that the presence of a head portion of a retaining foot of the container and/or the presence of a connecting shaft, formed between the container and the retaining foot, inside the counterstay, can be identified by means of the third sensor. Correct grasping of the object by the robot gripper and/or correct detachment of the object from the robot gripper can be identified by means of the third sensor. The container may be a cleanroom container. The cleanroom container can be designed as what is known as a FOUP. The cleanroom container can in particular be designed according to US 2009/0297299 A1 or in a manner analogous or similar thereto.

The object is furthermore achieved by a method for handling objects comprising at least one retaining foot in each case, in particular containers, by means of a robot, said method comprising the steps of:

moving a robot gripper towards a retaining foot of an object to be received, by means of moving a robot arm of the robot in a manner automatically controlled by a robot control of the robot arm that is designed to automatically move the links of the robot arm by adjusting the joints of the robot arm that connect the links of the robot arm, until a cutout of a counterstay of the robot gripper is flush with the retaining foot, pressing the robot gripper against the retaining foot of the object such that an adjustable actuator (12) of the robot gripper (4) is pressed against the retaining foot (6) of the object (5), is adjusted by the pressing, and as a result a bias is generated between the actuator (12) and counterstay (10), and in the process a head portion of the retaining foot penetrates through the cutout of the counterstay and into a free space of the robot gripper, rotating the robot gripper relative to the retaining foot of the object by means of moving the robot arm in a manner automatically controlled by the robot control that is designed to automatically move the links of the robot arm by adjusting the joints of the robot arm that connect the links of the robot arm, until at least one projection of the head portion of a retaining foot engages behind the cutout of the counterstay and pivots into at least one latching recess of the counterstay, fixing the object relative to the robot gripper in an arrangement in which the at least one projection of the head portion of the retaining foot engages behind the cutout of the counterstay and is pivoted into the at least one latching recess of the counterstay by means of a movement of the robot gripper (4) that opposes the pressing, such that a remaining bias of the actuator (12) braces the retaining foot (6) between the actuator (12) and the counterstay (10).

In the method, it may also be possible for the actuator to be automatically locked by a securing means, in the arrangement in which the at least one projection of the head portion of the retaining foot engages behind the cutout of the counterstay and is pivoted into the at least one latching recess of the counterstay, and the object is fixed relative to the robot gripper by means of pressing the adjustable actuator of the robot gripper against the retaining foot of the object.

The movement of the robot gripper towards the retaining foot of the object to be received, by means of moving the robot arm of the robot in a manner automatically controlled by the robot control that is designed to automatically move the links of the robot arm by adjusting the joints of the robot arm that connect the links of the robot arm, until a cutout of the counterstay is flush with the retaining foot, can be assisted in that, during operation of the robot arm that is force/torque-controlled by the robot control, a centering pin, fastened to the robot gripper, is moved towards the object, in a manner touching the head portion of the retaining foot of the object, until the cutout of the counterstay is flush with the head portion of the retaining foot of the object.

The movement of the robot gripper towards the retaining foot of the object to be received, by means of moving the robot arm of the robot in a manner automatically controlled by the robot control that is designed to automatically move the links of the robot arm by adjusting the joints of the robot arm that connect the links of the robot arm, until a cutout of the counterstay is flush with the retaining foot, can be assisted by at least one sensor that is arranged on the robot gripper and records at least one measured variable of a relative position of the robot gripper with respect to the object, and transmits said variable to the robot control for the purpose of automatically controlling the robot arm by means of robot control, on the basis of the at least one recorded measured variable.

It may be possible, in an inventive manner, for the method to be performed by means of a robot of which the tool flange carries a robot gripper according to one or more of the embodiments described.

A specific embodiment of the invention is explained in greater detail in the following description of the figures, with reference to the accompanying figures. Irrespective of the specific context in which they are mentioned, specific features of this embodiment that is given by way of example can represent general features of the invention, optionally also considered individually or also in other combinations of the features.

BRIEF DESCRIPTION OF THE DRAWINGS

The accompanying drawings, which are incorporated in and constitute a part of this specification, illustrate exemplary embodiments of the invention and, together with a general description of the invention given above, and the detailed description given below, serve to explain the principles of the invention.

FIGS. 7b and 8a show a snapshot of a situation in which the retaining foot of the container is positioned in the free space of the robot gripper, in a locking position in which the robot gripper is rotated relative to the retaining foot of the container, by 45 degrees compared with FIG. 7a.

DETAILED DESCRIPTION

Figure 1:
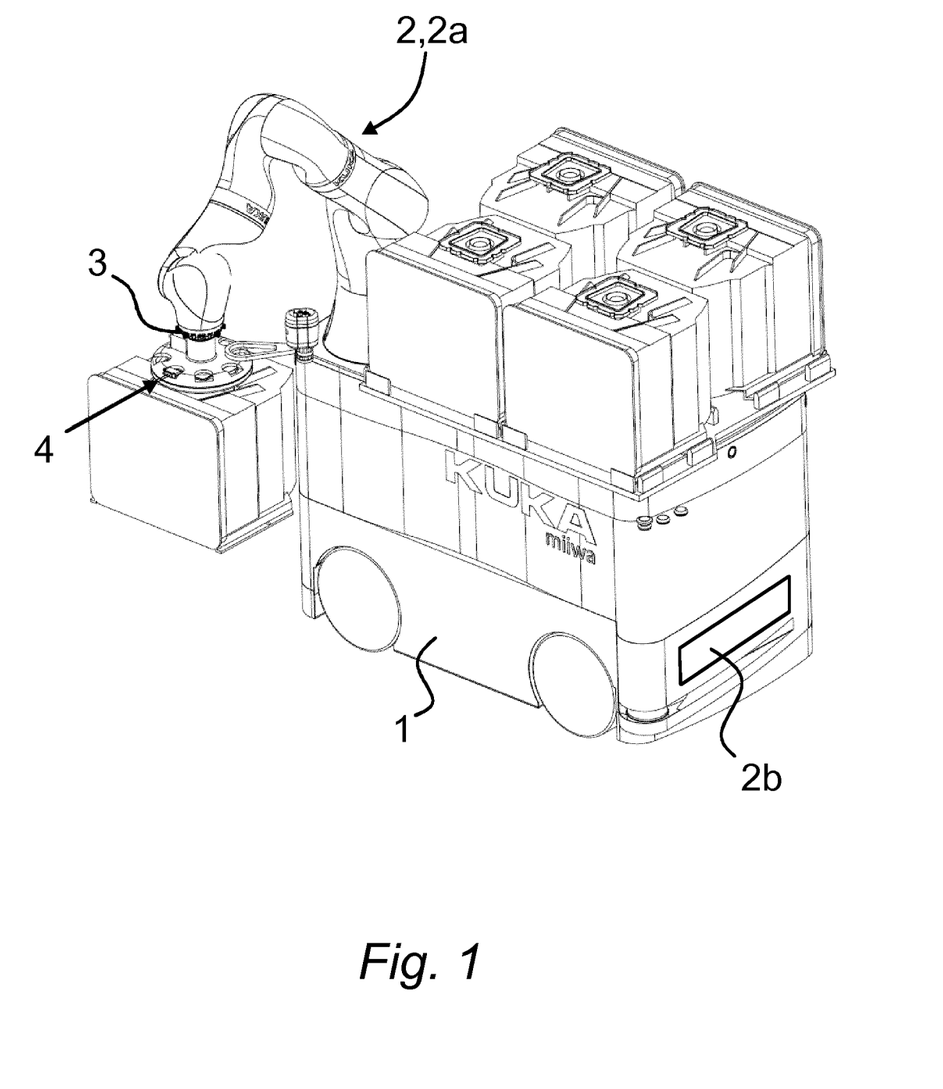
FIG. 1 is a perspective view of a handling situation, shown by way of example, in which a robot arranged on a driverless transport vehicle comprises a tool flange on which an inventive robot gripper is fastened, which robot gripper grips an object given by way of example, in particular a container given by way of example.

FIG. 1 shows, in a handling situation given by way of example, a robot 2 that is arranged on a driverless transport vehicle 1 and comprises a robot arm 2a and a robot control 2b. The robot arm 2a comprises a tool flange 3 on which an inventive robot gripper 4 is fastened, which robot gripper grips an object 5 given by way of example, in the present case a container 5 given by way of example.

Figures 2A, 2B, 2C:
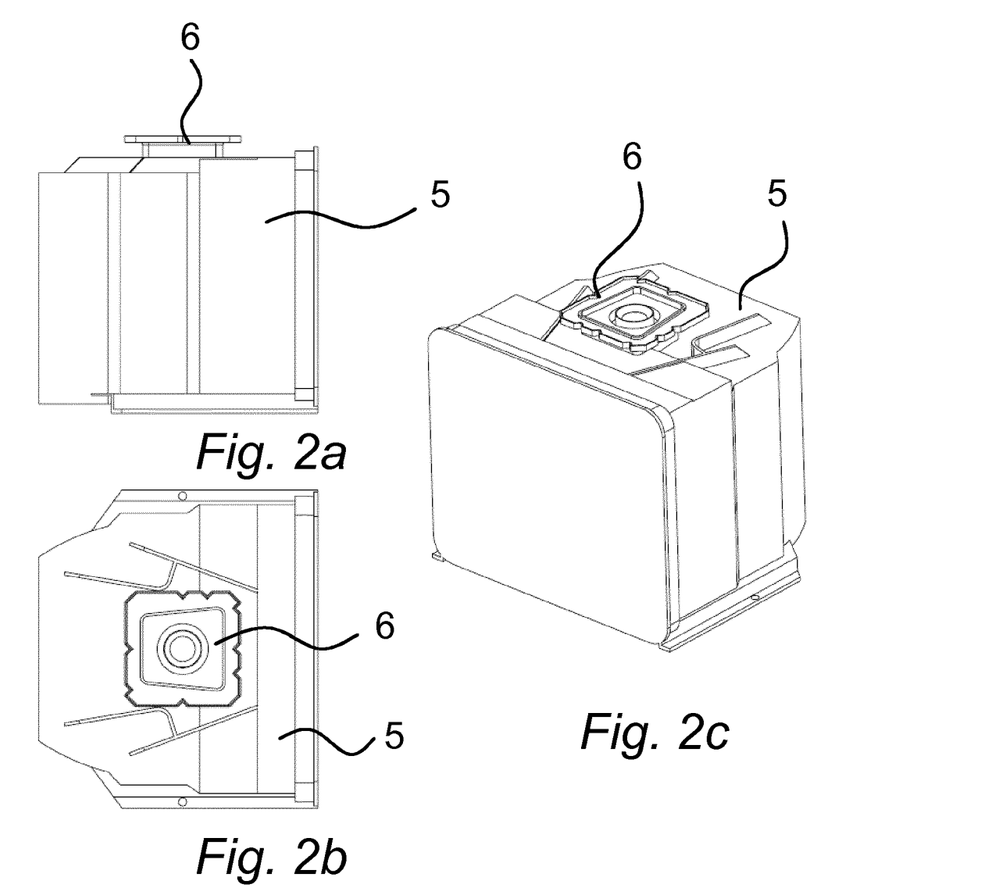
FIGS. 2a to 2c are three views of a container given by way of example, in an embodiment in the manner of a FOUP container.

As is clear from FIG. 2a to FIG. 2c, the object 5 or the container 5 comprises at least one, and in the case of the present embodiment exactly one, retaining foot 6. FIG. 1 shows a plurality of such objects 5 or containers 5, of which each object 5 or each container 5 comprises one single retaining foot 6 in each case.

Figure 3:
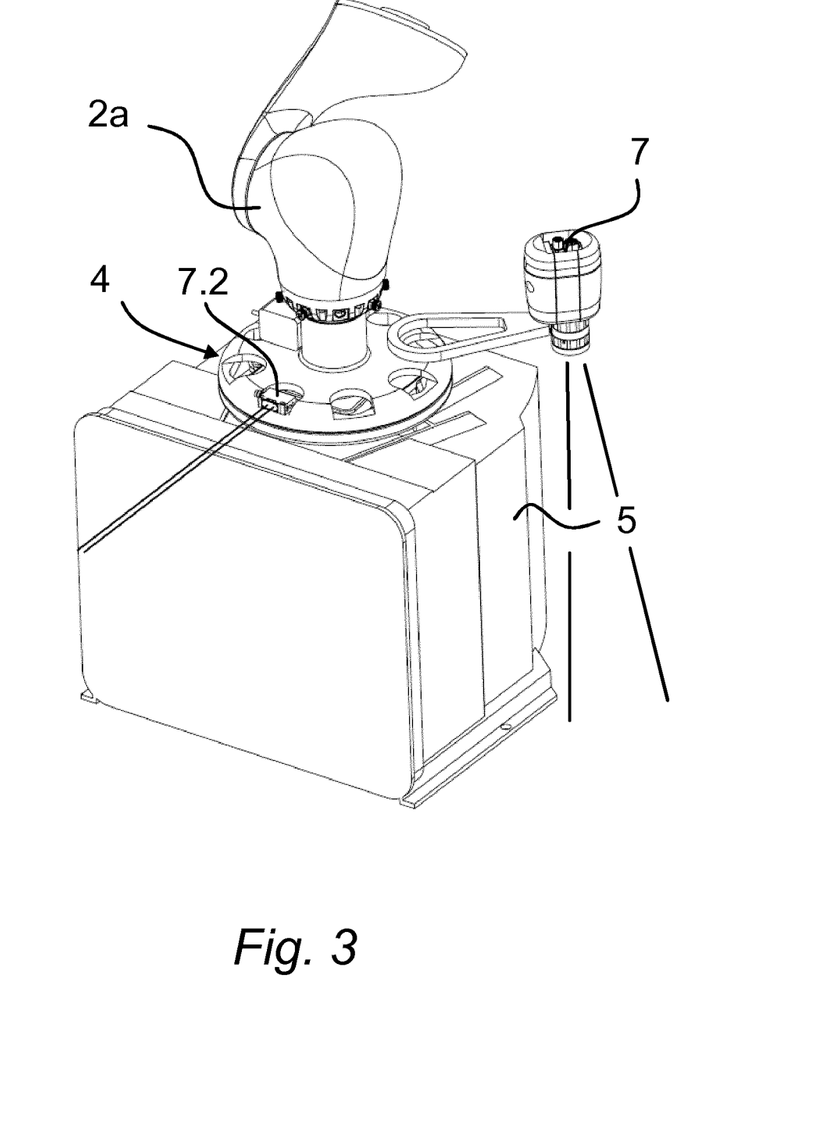
FIG. 3 is a perspective view of a detail of a robot arm together with a variant of an inventive robot gripper and a FOUP container according to FIGS. 2a to 2c.

FIG. 3 shows a detail of the robot arm 2a together with an embodiment of the robot gripper 4 in a gripping arrangement in which a FOUP container 5, given by way of example, is fastened, by the retaining foot 6 thereof, to the robot gripper 4. In the case of this embodiment, the robot gripper 4 comprises a sensor 7, for example in the form of a camera, which is designed to record the relative position of the robot gripper 4 with respect to the object 5 or container 5 in at least one measured variable, e.g. with respect to a distance A of the robot gripper 4 from a surface of the container 5 and/or from a side contour, in particular side contour edge, of the container 5.

In FIG. 3, the sensor 7 is designed as a camera that is oriented such that the optical axis thereof extends in parallel with a lateral longitudinal edge of the object 5.

Figure 9:
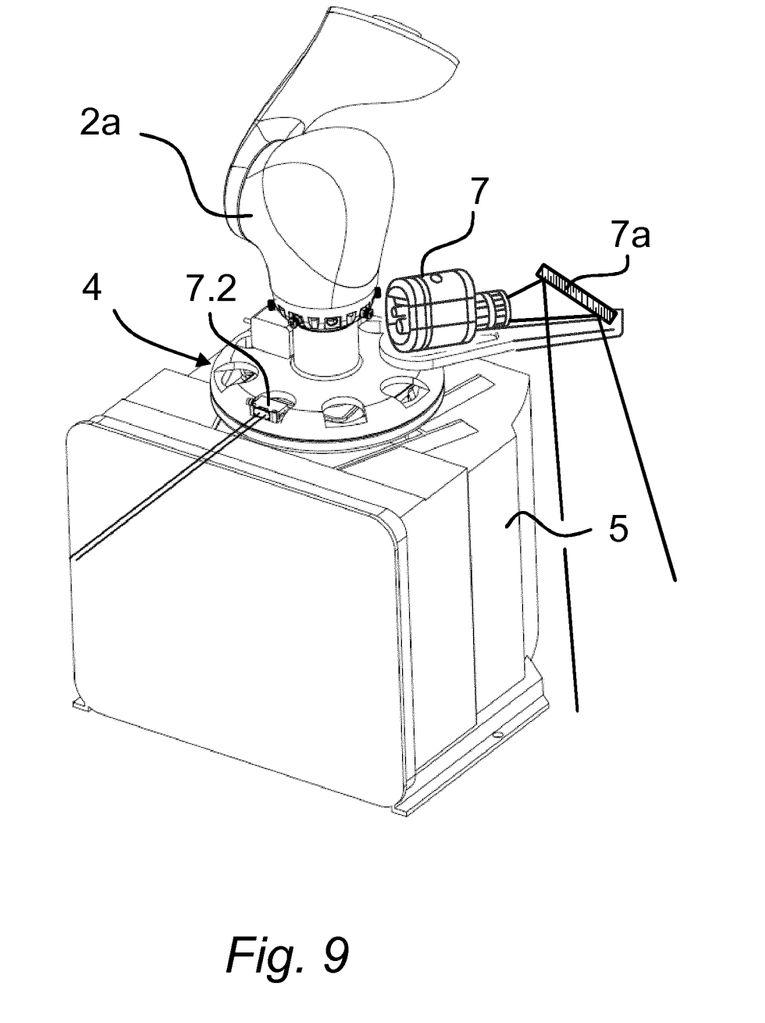
FIG. 9 is a perspective view of a detail of a robot arm together with a variant of an inventive robot gripper that is an alternative to that of FIG. 3 and in which the sensor is arranged so as to be horizontal instead of vertical and is supplemented by a deflection mirror.

Alternatively, as shown in FIG. 9, the sensor 7 may be designed as a camera that is oriented such that the optical axis thereof extends transversely to a lateral longitudinal edge of the object 5, the robot gripper 4 in this case comprising at least one deflection mirror 7a that is designed to deflect light from a direction extending in parallel with a lateral longitudinal edge of the object 5 into the direction extending transversely to the lateral longitudinal edge of the object 5, in which direction the optical axis of the camera extends. In this variant of FIG. 9, which is an alternative to FIG. 3, the sensor is oriented such that the optical axis thereof extends horizontally rather than vertically, and is supplemented by the deflection mirror 7a.

In all variants, i.e. also in the variants of FIG. 3 and FIG. 9 in each case, the robot gripper 4 may comprise a second sensor 7.2 that is designed and arranged so as to monitor, for obstacles, a space provided to the side of an object 5 gripped by the robot gripper 4.

Figure 4:
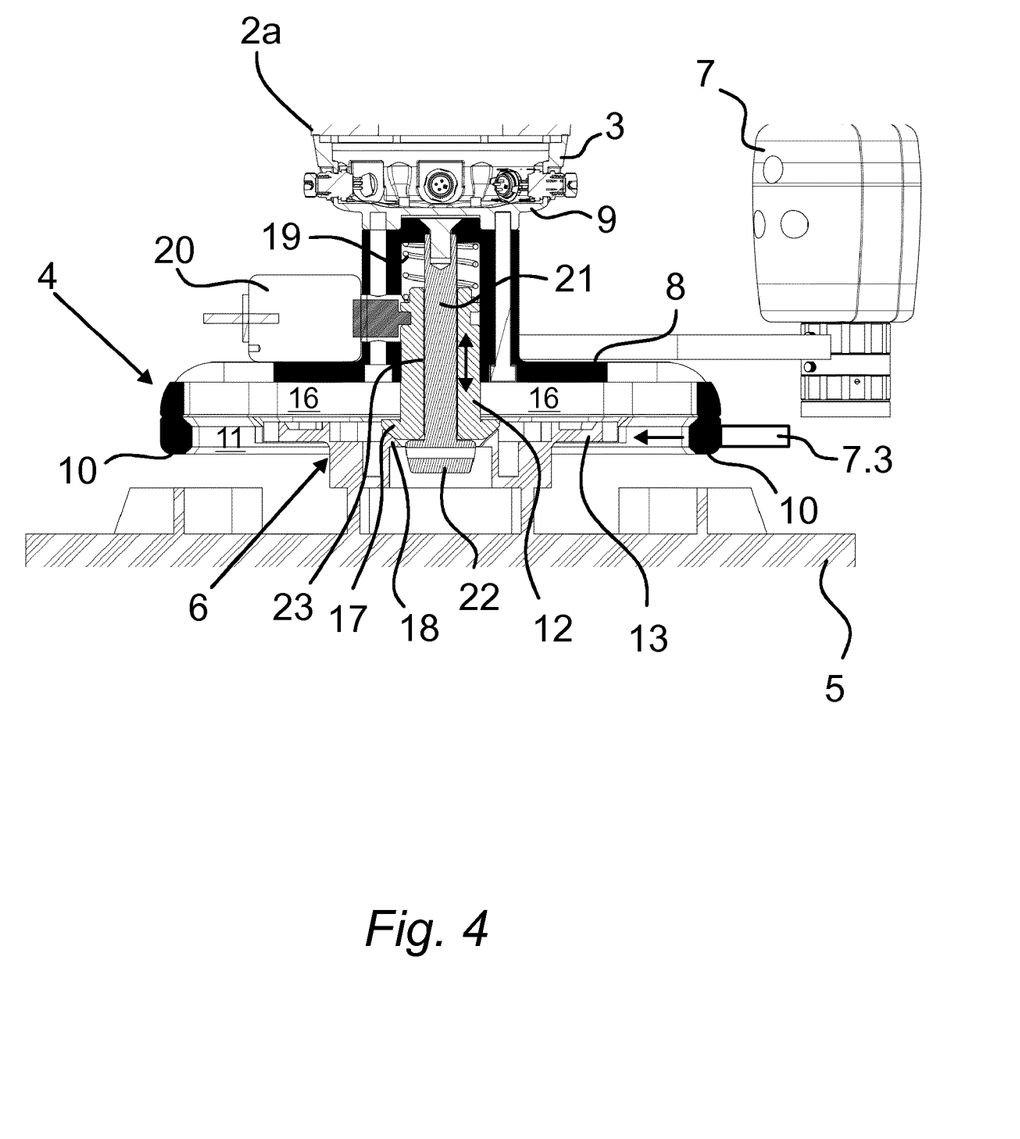
FIG. 4 is a cross section through the robot gripper in a position in which it has been moved towards a retaining foot of a container that is to be received.
Figure 5:
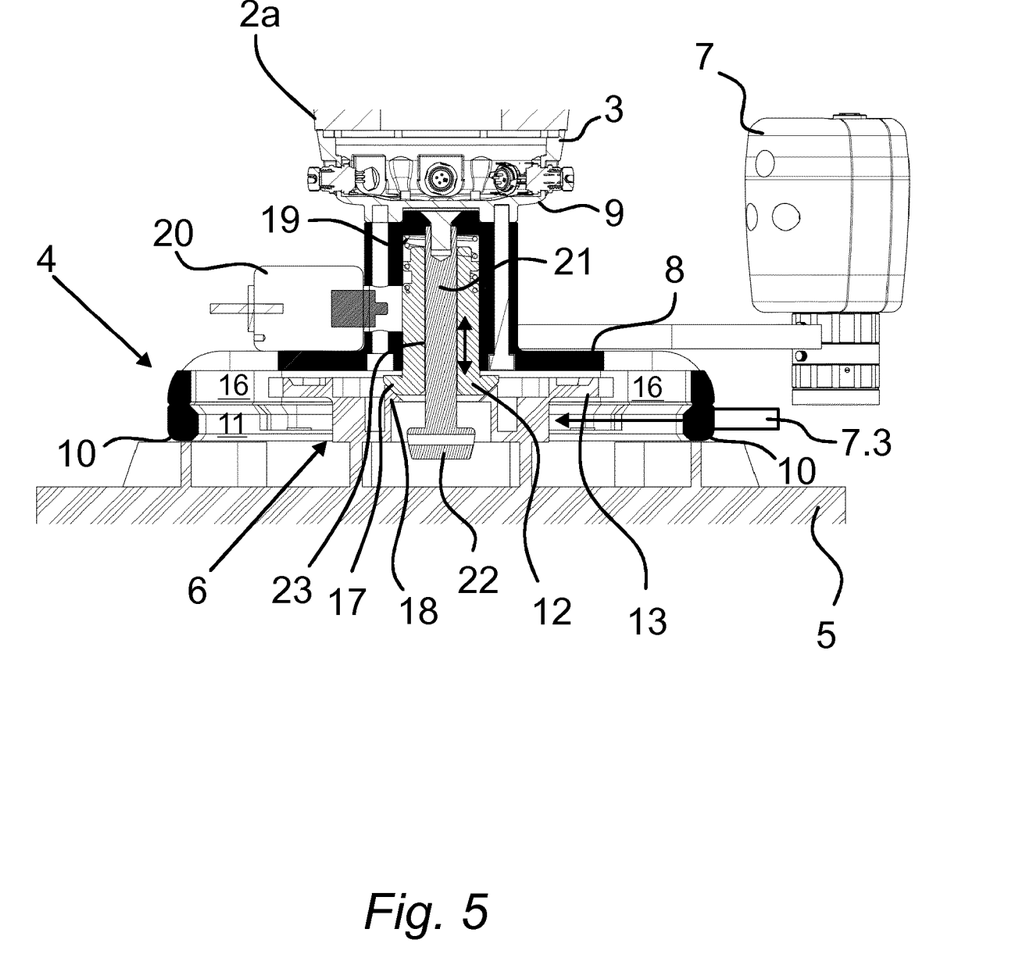
FIG. 5 is a cross section through the robot gripper in a position in which it is latched to the retaining foot of the container that is to be received.

As can be seen in particular in FIG. 4 and FIG. 5, the robot gripper 4 can comprise a third sensor 7.3 which is designed and arranged so as to monitor the presence of the object 5, in particular of the retaining foot 6 of the object 5 on the counterstay 10 of the robot gripper 4. For this purpose, the third sensor 7.3 can, as shown in FIG. 4 and FIG. 5, be arranged for example on the counterstay 10 and be oriented towards the inside, such that the presence of the head portion 13 of the retaining foot 6 of the container 5 and/or the presence of the connecting shaft, formed between the container 5 and the retaining foot 6, inside the counterstay 10, can be identified by means of the third sensor 7.3.

As is shown in particular in FIG. 4 and FIG. 5, the robot gripper 4 is used for handling containers 5 comprising at least one retaining foot 6, by means of a robot 2. The robot gripper 4 comprises a gripper body 8 that comprises a connection flange 9 which is designed for fastening the robot gripper 4 on the tool flange 3 of the robot arm 2a. The robot gripper 4 further comprises a counterstay 10 that is connected to the gripper body 8 and comprises a cutout 11, the shape and size of which is adjusted to the retaining foot 6 of the container 5, as is shown in particular in FIG. 6a to FIG. 8b.

An actuator 12 is adjustably mounted on the gripper body 8, which actuator is designed to press against the retaining foot 6 of the container 5, in a clamping position (FIG. 4), in order to fix said container 5 against the counterstay 10, as is shown in particular in FIG. 4. In a release position, as is shown in particular in FIG. 5, the retaining foot 6 is released by the actuator 12 such that the counterstay 10 is adjustable relative to the retaining foot 6, in order for it to be possible to detach the retaining foot 6 of the container 5 from the robot gripper 4.

The cutout 11 of the counterstay 10 is designed as a window cutout that is closed around the peripheral edge thereof, the inner contour of the window cutout at least substantially corresponding to an outer contour of a head portion 13 of the retaining foot 6 of the container 5, as can be seen in FIG. 6a to FIG. 8b. In this case, the outer contour of the head portion 13 of the retaining foot has a contour shape that forms at least one projection 14 that engages behind at least one latching recess 15 of the counterstay 10 in a locking position of the robot gripper 4, as is the case in FIG. 8b.

The counterstay 10 is fastened to the robot gripper 4 so as to be at a distance from the gripper body 8, such that a free space 16 (FIG. 4 and FIG. 5) is formed between the counterstay 10 and the gripper body 8, which free space is designed for the purpose of rotating the robot gripper 4 relative to the retaining foot 6 of the container 5 when the head portion 13 of the retaining foot 6 has plunged into the free space 16 of the robot gripper 4, beyond the cutout 11 of the counterstay 4, as is shown in particular in FIG. 5.

The counterstay 10 comprises an inner wall that faces the gripper body 8 and forms at least one latching recess 15 for the head portion 13 of the retaining foot 6 of the container 5 or of the at least one projection 14 of the head portion 13 of the retaining foot 6 of the container 5.

The actuator 12 is a punch that is arranged or mounted in the center of the robot gripper 4 so as to be axially adjustable and comprises a punch head 17 that is designed to press against a corresponding seat 18 on the head portion 13 of the retaining foot 6 of the container 5.

The actuator 12 is mounted on the gripper body 8 so as to be biased, by means of a spring device 19, such that the spring device 19 generates a spring force that presses the actuator 12, in the clamping position thereof, automatically against the head portion 13 or the seat 18 of the retaining foot 6 of the container 5.

In the case of the present embodiment, the robot gripper 4 comprises an optional securing means 20 which is designed for automatically locking the actuator 12 in the clamping position thereof.

Furthermore, in the case of the present embodiment, the robot gripper 4 may comprise an optional centering pin 21 that comprises a centering cone 22 at the free front end thereof. Furthermore, in the case of the present embodiment, the robot gripper 4 may comprise an optional centering pin 21 that forms a guide 23 on which the actuator 12 is guided in an axially adjustable manner.

Figure 6A:
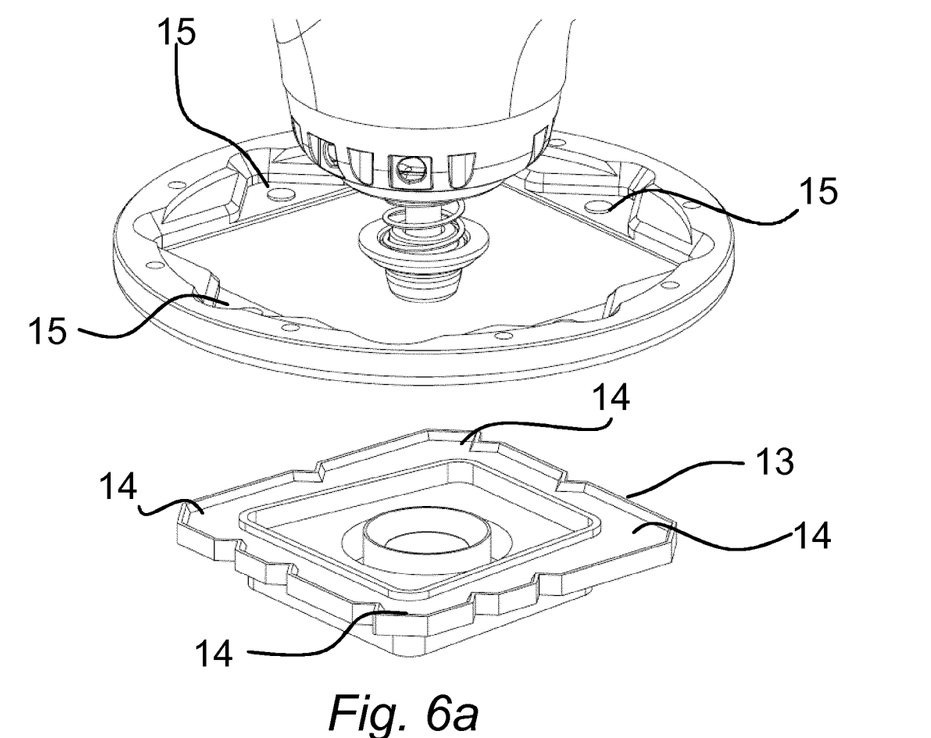
FIG. 6a is a snapshot of a situation in which the robot gripper is flush with the retaining foot of the container.

FIG. 6a is a snapshot of a situation in which the robot gripper is aligned with the retaining foot of the container. This corresponds to the method step of moving the robot gripper 4 towards the retaining foot 6 of the container 5 to be received, by means of moving the robot arm 2a of the robot 2 in a manner automatically controlled by the robot control 2b of the robot arm 2a that is designed to automatically move the links of the robot arm 2a by adjusting the joints of the robot arm 2a that connect the links of the robot arm 2a, until a cutout 11 of the counterstay 10 of the robot gripper 4 is flush with the retaining foot 6.

Figure 6B:
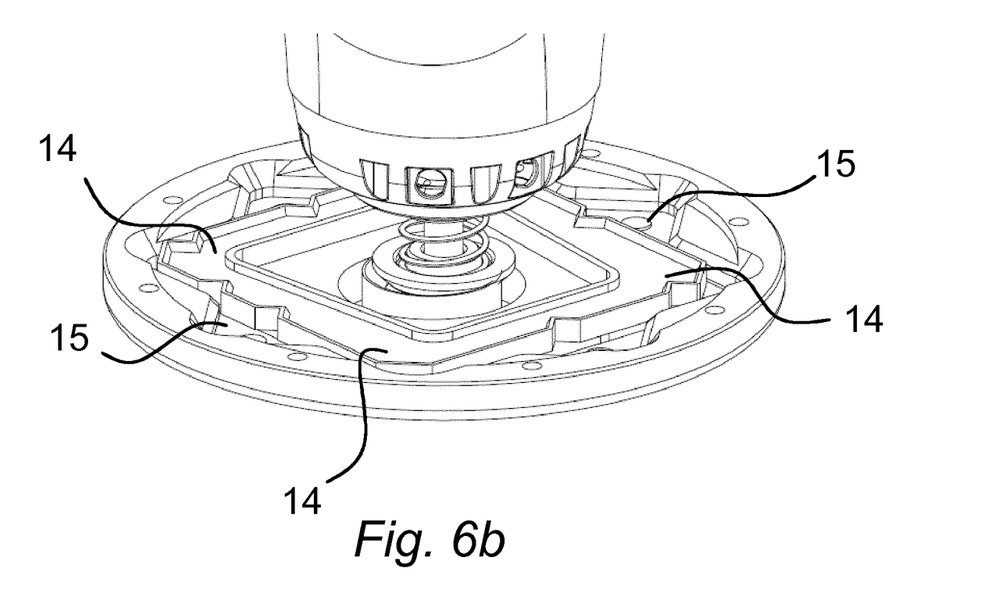
FIG. 6b is a snapshot of a situation in which the retaining foot of the container penetrates into the cutout of the robot gripper.

FIG. 6b is a snapshot of a situation in which the retaining foot 6 of the container 5 penetrates into the cutout 11 of the robot gripper 4. This corresponds to the method step of pressing the robot 4 against the retaining foot 6 of the container 5 such that the head portion 13 of the retaining foot 6 penetrates through the cutout 11 of the counterstay 10 and into the free space 16 of the robot gripper 4.

Figure 7A:
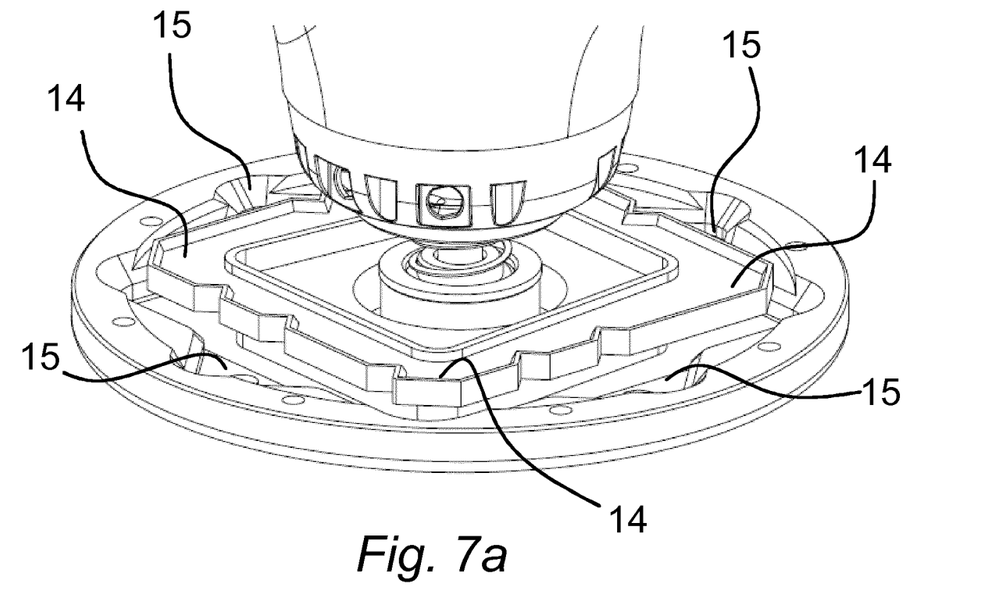
FIG. 7a is a snapshot of a situation in which the retaining foot of the container is positioned in a free space of the robot gripper, in an unlocking position, for rotating the robot gripper relative to the retaining foot of the container.

FIG. 7a is a snapshot of a situation in which the retaining foot 6 of the container 5 penetrates is positioned in the free space 16 of the robot gripper 4, in an unlocking position, for the purpose of rotating the robot gripper 4 relative to the retaining foot 6 of the container 5.

Figure 7B:
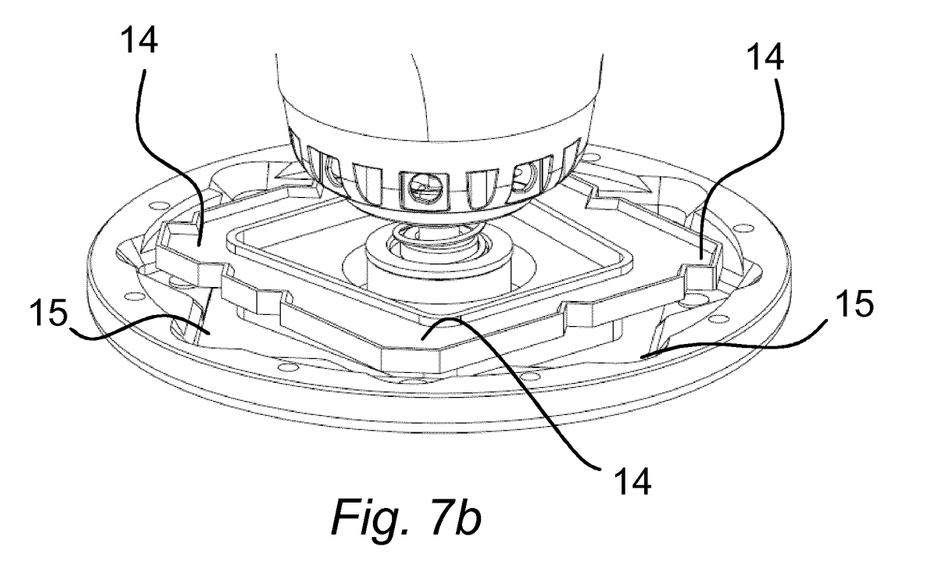
Figure 8A:
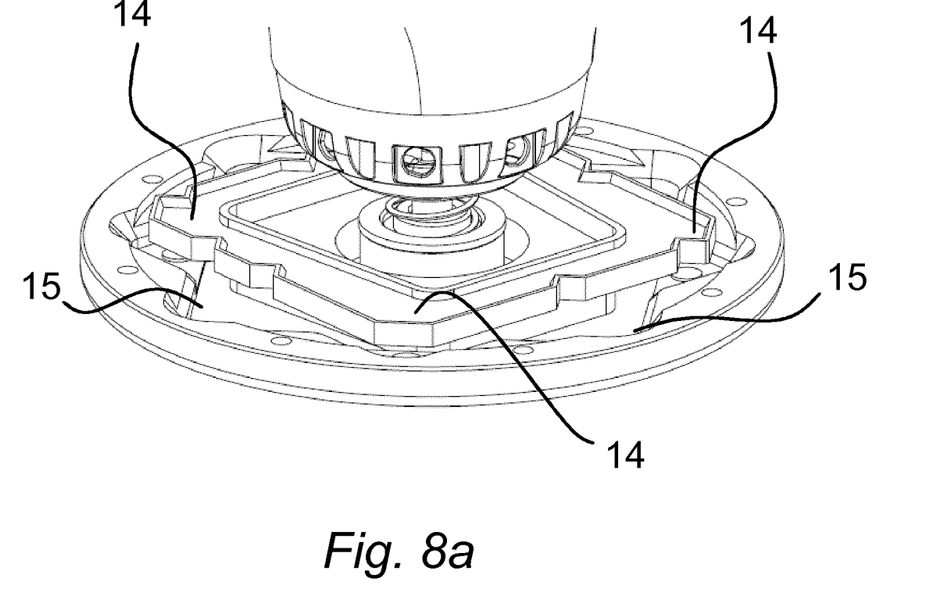

FIGS. 7b and 8a show, in an identical manner, a snapshot of a situation in which the retaining foot 6 of the container 5 is positioned in the free space 16 of the robot gripper 4, in a locking position in which the robot gripper 4, in particular the counterstay 10, is rotated relative to the retaining foot 6 of the container 5, by 45 degrees compared with FIG. 7a.

Accordingly, between the snapshots according to FIG. 7a and FIG. 7b, the method step of rotating the robot gripper 4 relative to the retaining foot 6 of the container 5 by means of moving the robot arm 2a in a manner automatically controlled by the robot control 2b that is designed to automatically move the links of the robot arm 2a by adjusting the joints of the robot arm 2a that connect the links of the robot arm 2a, until at least one projection 14, in the case of the present embodiment the four projections 14, of the head portion 13 of the retaining foot 6 engage behind the cutout 11 of the counterstay 10 and pivot into at least one latching recess 15, in the case of the present embodiment the four latching recesses 15, of the counterstay 10, is performed.

Figure 8B:
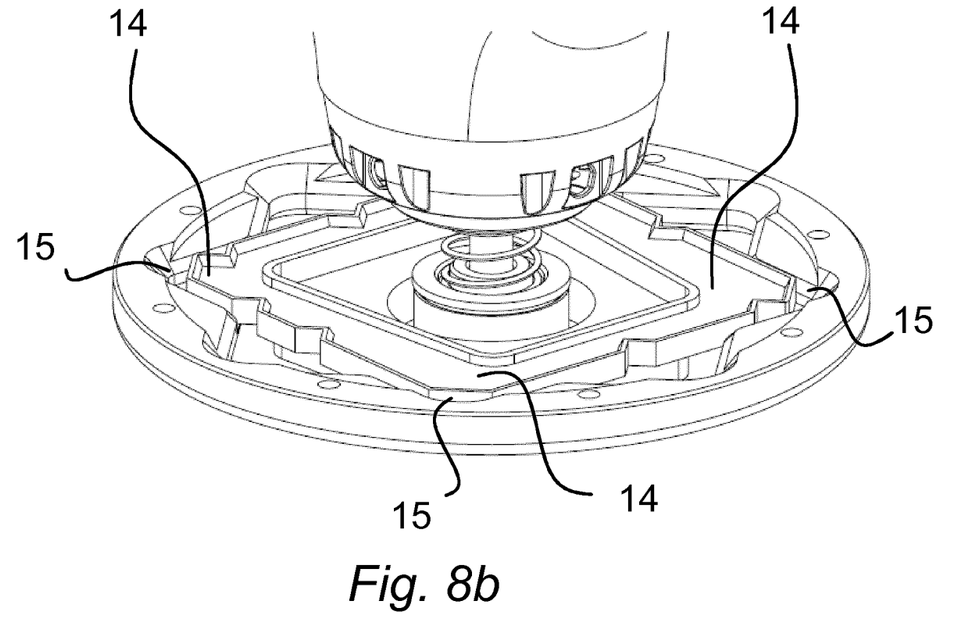
FIG. 8b is a snapshot of a situation in which the retaining foot of the container is fixed, in the clamping position thereof, to the robot gripper by means of an actuator of the robot gripper.

Finally, FIG. 8b is a snapshot of a situation in which the retaining foot 6 of the container 5 is fixed, in the clamping position thereof, to the robot gripper 4 by means of the actuator 12 of the robot gripper 4. This corresponds to the method step of fixing the container 5 relative to the robot gripper 4 in an arrangement in which the at least one projection 14 or the four projections 14 of the head portion 13 of the retaining foot 5 engage behind the cutout 11 of the counterstay 10 and are pivoted into the at least one latching recess 15 or the four latching recesses 15 of the counterstay 10 by means of pressing the adjustable actuator 12 of the robot gripper 4 against the retaining foot 13 or against the seat 18 of the container 5.

While the present invention has been illustrated by a description of various embodiments, and while these embodiments have been described in considerable detail, it is not intended to restrict or in any way limit the scope of the appended claims to such detail. The various features shown and described herein may be used alone or in any combination. Additional advantages and modifications will readily appear to those skilled in the art. The invention in its broader aspects is therefore not limited to the specific details, representative apparatus and method, and illustrative example shown and described. Accordingly, departures may be made from such details without departing from the spirit and scope of the general inventive concept.

What is claimed is:

1. A robot gripper for handling objects with a robot, wherein the objects include at least one retaining foot having a head portion, the robot gripper comprising:
    a gripper body comprising a connection flange configured for fastening the robot gripper to a tool flange of a robot arm;
    a counterstay connected to the gripper body and comprising a cutout;
    the shape and size of the cutout adapted to the retaining foot of the object such that the cutout is able to receive the retaining foot in a form-fitting manner; and
    an actuator arranged on the gripper body, the actuator operable to press against the retaining foot of the object in a clamping position of the actuator, in order to fix the retaining foot against the counterstay, and to release the retaining foot in a release position of the actuator, such that the counterstay is adjustable relative to the retaining foot whereby the retaining foot of the object may be detached from the robot gripper.

2. The robot gripper of claim 1, wherein the actuator is adjustably mounted on the gripper body.

3. The robot gripper of claim 1, wherein:
    the cutout of the counterstay is configured as a window cutout that is closed around the peripheral edge thereof;
    an inner contour of the window cutout at least substantially corresponds to an outer contour of the head portion of the retaining foot of the object; and
    the counterstay further includes at least one latching recess configured to engage at least one projection defined by a contour shape of an outer contour of the head portion of the retaining foot in a locking position of the robot gripper.

4. The robot gripper of claim 1, wherein:
    the counterstay is fastened to the robot gripper at a distance from the gripper body such that a free space is formed between the counterstay and the gripper body; and
    the free space is sized and arranged to facilitate rotating the robot gripper relative to the retaining foot of the object when the head portion of the retaining foot has entered the free space of the robot gripper, beyond the cutout of the counterstay.

5. The robot gripper of claim 3, wherein the counterstay further comprises an inner wall that faces the gripper body and forms at least one latching recess for the head portion of the retaining foot of the object, or the at least one projection of the head portion of the retaining foot of the object.

6. The robot gripper according of claim 1, wherein the actuator is a punch that is mounted in the center of the robot gripper so as to be axially adjustable, and comprising a punch head configured to press against a corresponding seat on the head portion of the retaining foot of the object.

7. The robot gripper of claim 1, wherein the actuator is mounted on the gripper body so as to be biased by a spring device such that, in the clamping position of the actuator, the spring device generates a spring force that presses the actuator automatically against the head portion of the retaining foot of the object.

8. The robot gripper of claim 1, further comprising a securing means configured for automatically locking the actuator in the clamping position thereof.

9. The robot gripper of claim 1, further comprising a centering pin extending axially therefrom, wherein at least one of:
    the centering pin comprises a centering cone on a free front end thereof; or
    the centering pin forms a guide on which the actuator is guided in an axially adjustable manner.

10. The robot gripper of claim 1, further comprising at least one sensor configured to sense a relative position of the robot gripper with respect to the object in at least one measured variable.

11. The robot gripper of claim 10, wherein the sensor is configured as a camera that is oriented such that an optical axis thereof extends parallel with respect to a lateral longitudinal edge of the object.

12. The robot gripper of claim 10, wherein:
    the sensor is configured as a camera that is oriented such that an optical axis thereof extends in a direction transverse to a lateral longitudinal edge of the object; and
    the robot gripper further comprises at least one deflection mirror that is configured to deflect light from a direction extending parallel to the lateral longitudinal edge of the object into the direction extending transverse to the lateral longitudinal edge of the object and in which direction the optical axis of the camera extends.

13. The robot gripper of claim 1, further comprising a second sensor that is configured and arranged so as to monitor, for obstacles, a space located to a side of an object gripped by the robot gripper.

14. The robot gripper of claim 1, further comprising a third sensor that is configured and arranged so as to monitor the presence of the object.

15. The robot gripper of claim 14, wherein the third sensor is configured and arranged so as to monitor the presence of the retaining foot of the object on the counterstay of the robot gripper.

16. A method for handling objects with a robot, wherein the objects have at least one retaining foot having a head portion and the robot includes a robot arm having a plurality of links connected by joints that move the links under the control of a robot controller, the method comprising:
    moving a robot gripper with the robot arm controlled by the robot controller toward the retaining foot of an object to be received, until a cutout of a counterstay of the robot gripper is aligned with the retaining foot;
    pressing the robot gripper against the retaining foot of the object with the robot arm controlled by the robot controller, such that an adjustable actuator of the robot gripper is pressed against the retaining foot of the object, whereby the actuator is adjusted by the pressing and, as a result, a bias is generated between the actuator and the counterstay and, in the process, the head portion of the retaining foot penetrates through the cutout of the counterstay and into a free space of the robot gripper;

rotating the robot gripper relative to the retaining foot of the object with the robot arm controlled by the robot controller, until at least one projection of the head portion of the retaining foot engages behind the cutout of the counterstay and pivots into at least one latching recess of the counterstay; and fixing the object relative to the robot gripper in an arrangement in which the at least one projection of the head portion of the retaining foot engages behind the cutout of the counterstay and is pivoted into the at least one latching recess of the counterstay by a movement of the robot gripper that opposes the pressing, such that a remaining bias of the actuator braces the retaining foot between the actuator and the counterstay.

17. The method of claim 16, further comprising:

automatically locking the actuator by a securing means in the configuration where the at least one projection of the head portion of the retaining foot engages behind the cutout of the counterstay and is pivoted into the at least one latching recess of the counterstay; and fixing the object relative to the robot gripper by pressing the adjustable actuator of the robot gripper against the retaining foot of the object.

18. The method of claim 16, wherein moving the robot gripper toward the retaining foot of an object to be received comprises moving the robot arm under force/torque control of the robot controller to thereby move a centering pin fastened to the robot gripper toward the object, with the centering pin touching the head portion of the retaining foot of the container, until the cutout of the counterstay is aligned with the head portion of the retaining foot.

19. The method of claim 16, wherein moving the robot gripper toward the retaining foot of an object to be received comprises, recording at least one measured variable of a relative position of the robot gripper with respect to the object with at least one sensor that is arranged on the robot gripper;

transmitting the at least one measured variable to the robot control; and automatically controlling the robot arm by the robot controller on the basis of the at least one recorded measured variable.

20. The method of claim 16, wherein the method is performed by a robot carrying a robot gripper that comprises:

a gripper body comprising a connection flange configured for fastening the robot gripper to a tool flange of a robot arm;

a counterstay connected to the gripper body and comprising a cutout;

the shape and size of the cutout adapted to the retaining foot of the object such that the cutout is able to receive the retaining foot in a form-fitting manner; and an actuator arranged on the gripper body, the actuator operable to press against the retaining foot of the object in a clamping position of the actuator, in order to fix said foot against the counterstay, and to release the retaining foot in a release position of the actuator, such that the counterstay is adjustable relative to the retaining foot whereby the retaining foot of the object may be detached from the robot gripper.

* * * * *